US012336255B2

(12) United States Patent
Blank et al.

(10) Patent No.: US 12,336,255 B2
(45) Date of Patent: *Jun. 17, 2025

(54) SEMICONDUCTOR DIE HAVING A SODIUM STOPPER IN AN INSULATION LAYER GROOVE AND METHOD OF MANUFACTURING THE SAME

(71) Applicant: Infineon Technologies Austria AG, Villach (AT)

(72) Inventors: Oliver Blank, Villach (AT); Christof Altstätter, Amlach (AT); Ingmar Neumann, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 18/327,112

(22) Filed: Jun. 1, 2023

(65) Prior Publication Data

US 2023/0307512 A1   Sep. 28, 2023

Related U.S. Application Data

(63) Continuation of application No. 17/156,693, filed on Jan. 25, 2021, now Pat. No. 11,699,726.

(30) Foreign Application Priority Data

Feb. 4, 2020   (EP) .................................... 20155344

(51) Int. Cl.
*H01L 29/40*   (2006.01)
*H01L 21/765*   (2006.01)
*H01L 23/00*   (2006.01)
*H10D 30/66*   (2025.01)
*H10D 64/00*   (2025.01)

(52) U.S. Cl.
CPC ......... *H10D 64/117* (2025.01); *H01L 21/765* (2013.01); *H01L 23/562* (2013.01); *H10D 30/665* (2025.01)

(58) Field of Classification Search
CPC ... H01L 29/407; H01L 21/765; H01L 23/562; H10D 64/117; H10D 30/665
See application file for complete search history.

(56) References Cited

U.S. PATENT DOCUMENTS 6,818,958 B2   11/2004   Spring
7,989,887 B2   8/2011   Hsieh
(Continued)

FOREIGN PATENT DOCUMENTS

EP          0506129 A1    9/1992
KR      20130061036 A    6/2013
WO         03096406 A1   11/2003

*Primary Examiner* — Eugene Lee
(74) *Attorney, Agent, or Firm* — Murphy, Bilak & Homiller, PLLC

(57) ABSTRACT

The application relates to a semiconductor die having a semiconductor body including an active region, an insulation layer on the semiconductor body, and a sodium stopper formed in the insulation layer. The sodium stopper is arranged in an insulation layer groove which intersects the insulation layer vertically and extends around the active region. The sodium stopper is formed of a tungsten material that at least partly fills the insulation layer groove. Both the insulation layer groove and the tungsten material extend into the semiconductor body.

23 Claims, 7 Drawing Sheets

(56) References Cited

U.S. PATENT DOCUMENTS

| | | |
|---|---|---|
| 8,564,053 B2 | 10/2013 | Hsieh |
| 9,620,636 B2 | 4/2017 | Siemieniec et al. |
| 2002/0149079 A1 | 10/2002 | Spring |
| 2004/0113201 A1 | 6/2004 | Bhalla et al. |
| 2004/0262678 A1 | 12/2004 | Nakazawa et al. |
| 2009/0057756 A1* | 3/2009 | Hshieh ............ H01L 29/407 257/E21.409 |
| 2009/0090967 A1 | 4/2009 | Chen et al. |
| 2010/0044796 A1* | 2/2010 | Hshieh ............ H01L 21/823475 257/365 |
| 2010/0078774 A1 | 4/2010 | Hirler |
| 2010/0289059 A1* | 11/2010 | Hsieh ............ H01L 24/49 257/334 |
| 2011/0121386 A1* | 5/2011 | Hsieh ............ H01L 29/66727 257/334 |
| 2011/0180844 A1* | 7/2011 | Hsieh ............ H01L 29/42372 257/E29.198 |
| 2013/0175612 A1* | 7/2013 | Tai ............ H01L 29/66734 257/334 |
| 2013/0228860 A1* | 9/2013 | Chang ............ H01L 29/7813 257/334 |
| 2014/0077262 A1 | 3/2014 | Zundel et al. |
| 2016/0064548 A1 | 3/2016 | Laforet et al. |
| 2016/0380063 A1 | 12/2016 | Hirler et al. |
| 2017/0054012 A1* | 2/2017 | Hutzler ............ H01L 29/6634 |
| 2017/0098616 A1 | 4/2017 | Kaltalioglu et al. |
| 2017/0250255 A1 | 8/2017 | Siemieniec et al. |
| 2017/0309713 A1 | 10/2017 | Hirler et al. |
| 2017/0330941 A1* | 11/2017 | Hutzler ............ H01L 23/485 |
| 2018/0122934 A1 | 5/2018 | Laforet et al. |
| 2018/0269293 A1* | 9/2018 | Yilmaz ............ H01L 29/665 |
| 2019/0115302 A1 | 4/2019 | Blank et al. |
| 2019/0206986 A1* | 7/2019 | Hu ............ H01L 29/7397 |
| 2021/0020776 A1 | 1/2021 | Hsieh |
| 2021/0028305 A1* | 1/2021 | Hsieh ............ H01L 29/66734 |
| 2021/0104624 A1 | 4/2021 | Hsieh |
| 2021/0265498 A1 | 8/2021 | Hsieh |

* cited by examiner

SEMICONDUCTOR DIE HAVING A SODIUM STOPPER IN AN INSULATION LAYER GROOVE AND METHOD OF MANUFACTURING THE SAME

TECHNICAL FIELD

The present disclosure relates to a semiconductor die comprising a semiconductor body.

BACKGROUND

The semiconductor body comprises an active region. There, for instance a vertical field effect transistor can be formed, having a vertical channel in a body region laterally aside a gate region. By applying a gate voltage, the channel formation can be controlled, namely the vertical current flow between source and drain. In case of a power transistor device, a drift region can additionally be arranged between the body and the drain region. This shall illustrate a possible device formed in the active region, without limiting the universality of the claims and the description.

SUMMARY

It is an object of the present application to provide a semiconductor die with an improved design, as well as a method of manufacturing such a die.

The die comprises a sodium stopper formed in an insulation layer arranged on the semiconductor body. The sodium stopper is formed of tungsten filled insulation layer groove which intersects the insulation layer in the vertical direction. Laterally, namely perpendicularly to the vertical direction, the insulation layer groove extends around the active region.

A sodium diffusion can in particular occur in undoped layers, and the vertical intersection formed by the sodium stopper can cut a diffusion path in the insulation layer. In particular, it can prevent a sodium diffusion from the edge of the die via the insulation layer into the active region. Therein, the tungsten material filler can allow for a compact design, namely a reduced lateral width of the insulation layer groove (e. g. in comparison to an aluminum material filler).

The insulation layer groove can for instance have a lateral width of not more than 2000 nm, 1500 nm or 1000 nm, possible lower limits being for instance 80 nm, 100 nm or 120 nm. In general words, an idea of this application is to interrupt the insulation layer with a rather narrow insulation layer groove (e. g. with a lateral width between 120-1000 nm), which can for instance reduce the area consumption of the edge termination region.

Particular embodiments and features are provided in this description and in the claims. Therein, the individual features shall be disclosed independently of a specific claim category, the disclosure relates to apparatus and device aspects, but also to method and use aspects. If for instance a die or wafer manufactured in a specific way is described, this is also a disclosure of a respective manufacturing process, and vice versa.

The "vertical" direction lies perpendicular to a surface of a layer of the die or wafer, for instance a surface of the insulation layer and/or a surface of the semiconductor body. For instance, the frontside of the insulation layer lies vertically opposite to the semiconductor body. The insulation layer groove intersects the insulation layer vertically, namely extends vertically over the whole distance from the frontside of the insulation layer to the backside thereof. It can for instance also extend further downwards into the semiconductor body (e.g. to form a drain contact). In particular, the insulation layer groove can extend steplessly into the semiconductor body, e.g. without a step between the insulation layer and the semiconductor body, for instance without a discontinuity in diameter. Seen in a vertical cross-section, to avoid a sodium diffusion path circumventing the sodium stopper, a vertical axis through the insulation layer groove does for instance not intersect any insulating material being in contact with the insulation layer, in particular no oxide. For instance, no trench is formed in the semiconductor body vertically below the insulation layer groove, e.g. no trench which is partially or completely filled with an insulation layer material, in particular no trench filled partially or completely with oxide.

The lateral directions lie perpendicular to the vertical direction, and the insulation layer groove or sodium stopper extends laterally around the active region. Seen in a top view, namely in a vertical viewing direction, the insulation layer groove/sodium stopper can extend around the active region over a partial or in particular over a whole circumference. It can separate the active region from the die edge in all lateral directions, forming for instance a closed line seen in the top view (e. g. with a rectangular shape). The sodium stopper is arranged in the edge termination region between the active region and the edge of the die.

In the active region, a frontside metallization can be arranged on the frontside of the insulation layer, for instance copper or in particular aluminum, e. g. AlCu. It can have a thickness of several micrometers and form a source contact. In the semiconductor body, a transistor device can be arranged in the active region, for example a lateral device (with a lateral channel) or in particular a vertical device. As a power device, the transistor can for instance have a breakdown voltage of at least 10 V, 20 V or 40 V, with possible upper limits of for instance not more than 800 V, 600 V, 400 V, 200 V or 100 V.

A vertical device can comprise a source region formed at the frontside in the semiconductor body, e. g. adjacent to the insulation layer, and a drain region formed vertically opposite thereto, e. g. at the backside of the semiconductor body. The drain region can extend over the whole backside of the wafer or die, and a backside metallization for contacting the drain region can be arranged on the backside. Vertically below the source region, the body region can be formed, wherein the gate region can be arranged laterally aside, for instance in a gate trench. The latter can extend into the semiconductor body from the frontside thereof, it can be filled with a gate dielectric covering at least a side wall of the trench and a gate electrode made of an electrically conductive material, for instance polysilicon. Vertically in between the body and the drain region, a drift region can be arranged, being of the same conductivity type as the body region but having a lower doping concentration.

In general, a field electrode can additionally be arranged in the gate trench below the gate electrode ("split gate"). In addition or in particular as an alternative, a field electrode can be arranged in a separate field electrode trench laterally aside the gate trench. Seen in a vertical cross-section, the gate and the field electrode trenches are arranged consecutive in a lateral direction. The gate trenches can for instance be longitudinal trenches which, seen in a top view, can for example form a grid in the active region, the grid defining cells, e. g. rectangular or in particular quadratic cells. In each cell, a needle shaped field electrode trench can be arranged, e. g. centrally in the cell. In the needle trench, a spicular or columnar field electrode can be formed, separated from the semiconductor body by a field oxide. Together, the field oxide and the field electrode form a field electrode region.

Independently of the design in the active region, the semiconductor body can for instance comprise a semiconductor substrate (e. g. silicon), additionally it can comprise an epitaxial layer on the substrate. In the epitaxial layer, the source and body region can be formed, as well as the drift region. The insulation layer is formed on the semiconductor body, it can comprise an oxide, for instance silicon oxide and/or a Borophosphorsilicate glass (BPSG). In particular, the insulation layer can be formed of stacked sublayers, for instance a lower oxide layer and a BPSG layer on top. In general, the tungsten material can fill the insulation layer groove only partly, e. g. only a lower portion of the groove. Alternatively, it can fill the insulation layer groove entirely, from its lower end to the upper end.

In an embodiment, a metallization layer made of tungsten material is formed on the frontside of the insulation layer. It is arranged in the edge termination region and covers at least a lateral section of the insulation layer groove. It can cover the entire insulation layer groove or only a lateral portion thereof, e. g. a portion arranged at a corner of the die. The tungsten metallization layer can for instance be advantageous due to its mechanical stability, in particular in comparison to AlCu. This can reduce a ratcheting or buckling, for example in the corners of the die, and a thin tungsten layer can also be structured more precisely. The metallization layer made of the tungsten material can for instance have a vertical thickness of at least 20 nm or 30 nm, possible upper limits being for instance 700 nm, 600 nm or 500 nm. Limiting the thickness can be advantageous in terms of the mechanical stress, e. g. prevent a damage of the insulation layer.

In an embodiment, the tungsten material filling the insulation layer groove and the tungsten material forming the metallization layer can be deposited in the same process step, namely with a single tungsten deposition. Alternatively, a multistep process can be applied, the insulation layer groove being filled in a first step, and the metallization layer being formed in a separate second step subsequently. In between the first and the second step, excess tungsten can be removed from the frontside of the passivation layer, e. g. by a planarization, for instance chemical-mechanical-polishing (CMP). In general, a titanium and/or titanium nitride deposition can precede any tungsten deposition, independently of whether the metallization layer or the tungsten filler is formed.

Above, a possible reduction of the area consumption in the edge termination region has been discussed. In this respect, the metallization layer can for instance have a lateral width of not more than 6 µm, 5 µm, 4 µm, 3 µm or 2 µm, possible lower limits being for instance at least 300 nm, 500 nm or 700 nm. The lateral width can be taken in a vertical cross-section, the sectional plane intersecting the die for instance diagonally, namely along a diagonal from one corner of the die to the diagonally opposite corner. In sum, the metallization layer can for example have an area in a range between 0.04 µm$^2$ and 200 µm$^2$, depending also on the die size.

In an embodiment, the metallization layer is covered by a passivation layer, for instance imide. When the tungsten material forms the metallization layer, for instance no other metal material is arranged vertically between the tungsten and the passivation layer. In other words, the passivation layer can be formed in a direct contact with the tungsten metallization layer, it can for instance be deposited directly onto the latter. Laterally, the passivation layer can cover a portion or in particular the whole metallization layer.

In an embodiment, the tungsten material arranged in the insulation layer groove forms also a drain contact electrically connected to a drain region of the die. As discussed above, the drain region can be formed at a backside of the semiconductor body, wherein the electrical potential is gradually reduced towards the frontside in the active region, reaching the source potential for instance at the body region, e. g. where the body region is contacted. In contrast, in the edge termination region where the sodium stopper is formed, the semiconductor body below the insulation layer can also be on drain potential. In particular, an epitaxial layer comprising source and body in the active region can be on the drain potential in the edge termination region.

To form the drain contact, the insulation layer groove can extend into the semiconductor body, in particular into the epitaxial layer. Consequently, the tungsten material filler extends into the semiconductor body as well. To enhance the electrical contact, a contact region of the semiconductor body, which is intersected by the tungsten material filler, can for instance be doped, in particular with a higher doping concentration compared to the drift region. It can for example be doped like a source region formed in the active region. Alternatively, it can be formed of polysilicon, e. g. doped polysilicon. Laterally, the drain contact or the contact region does not necessarily extend along the whole length of the sodium stopper.

In an embodiment, the edge termination region comprises an additional channel stopper in a channel stopper trench. The trench can be filled with a conductive material, e.g. polysilicon, and by applying an electrical potential it can prevent ions from entering. In particular, the channel stopper trench can have the same vertical extension as a gate trench formed in the active region. Like the sodium stopper, the channel stopper is arranged laterally between the active region and the die edge, for instance laterally between the sodium stopper and the die edge. When the sodium stopper forms also a drain contact (see above), the latter can be arranged closer to the active region, namely closer to the active region than the channel stopper. Seen in a vertical cross-section, the insulation layer groove can for instance have a smaller lateral width than the channel stopper trench in the semiconductor body. To apply the electrical potential for the channel stopper function, the channel stopper can for instance be contacted via the same tungsten material frontside metallization like the sodium stopper.

In an embodiment, a chipping stopper trench is additionally formed in the edge termination region, in addition to the sodium stopper and/or the channel stopper. In particular, the chipping stopper trench can extend deeper into the semiconductor body than the channel stopper trench. This combination of a channel trench and a chipping stopper trench having a different depth shall also be disclosed independently of a sodium stopper with a tungsten material filler. The channel stopper trench can for instance have a vertical depth of 200 nm at minimum and 1200 nm at maximum. The vertical depth of the chipping stopper trench can for instance be 400 nm at minimum and 18000 nm at maximum. A depth difference between the channel and the chipping stopper trenches can for instance be at least 100 nm, 200 nm, 300 nm or 400 nm, possible upper limits being for instance 17000 nm, 12000 nm, 10000 nm, 8000 nm, 6000 nm, 4000 nm, 3000 nm, 2500 nm, 1800 nm, 1600 nm, 1400 nm, 1200 nm or 1000 nm.

The channel stopper trench can have the same vertical depth as a gate trench in the active region. It can for instance be etched and/or filled in the same process step or steps like the gate trench. The chipping stopper trench can for example have the same vertical depth as a field electrode trench in the active region, e. g. a needle trench disclosed above. The chipping stopper trench can be etched and/or filled in the same process step or steps as the field electrode trench.

The chipping stopper trench can act as a predetermined cracking or breaking point, stopping for instance a die cracking by releasing the mechanical stress at a defined location. In an embodiment, the chipping stopper trench is filled with an electrically conductive material and serves also as a channel stopper. In particular, the electrically conductive material in the chipping stopper trench can be contacted via the tungsten material metallization layer which contacts also the sodium stopper and/or the channel stopper discussed above. The electrically conductive material can for instance be polysilicon, the chipping stopper trench being filled e. g. with oxide and polysilicon. In particular, it can be filled like a field electrode trench in the active region. Above the chipping stopper trench, a groove can be formed in the insulation layer vertically aligned with the chipping stopper trench, the groove being filled with an electrically conductive material (e. g. tungsten material) which electrically connects the filler of the chipping stopper trench to the metallization layer.

In total, e. g. at least two chipping stopper trenches can be formed between the active region and the die edge, in particular at least two combined channel and chipping stoppers. Possible upper limits can be eight or six chipping stoppers at maximum, in particular not more than three combined channel and chipping stoppers. In the edge termination region, the sodium stopper can for instance be arranged laterally between the at least two combined channel and chipping stoppers, one combined channel and chipping stopper being arranged laterally between the active region and the sodium stopper, another combined channel and chipping stopper being arranged laterally between the sodium stopper and the die edge. When the sodium stopper is also used as a drain contact (see above), for instance one combined channel and chipping stopper at maximum can be arranged laterally between the drain contact and the active region, the drain contact being arranged comparably close to the active region. When the lateral relative arrangement of edge termination structures is discussed, this relates in particular to the arrangement of the structures on the same of the active region in a cross-sectional view.

In an embodiment, a vertical groove intersecting the insulation layer can be formed vertically aligned with the chipping stopper trench, the groove acting as an oxide peeling stopper. It can for instance be arranged laterally in between the sodium stopper and the die edge and/or laterally in between a channel stopper, e. g. the channel stopper formed in a trench having a reduced depth, and the die edge. The combined chipping and oxide peeling structure can in particular be an alternative to a combined channel and chipping stopper, differing from the latter e. g. in that no metallization layer is formed on the frontside of the insulation layer vertically above the chipping and oxide peeling stopper. However, the oxide peeling stopper groove can for instance be covered by a passivation layer, e. g. imide.

The oxide peeling stopper groove can be filled, for instance like the other groove or grooves in the insulation layer (of the sodium and/or channel stopper), e. g. with a tungsten material. The chipping stopper trench below the oxide peeling stopper groove can be filled like a field electrode trench in the active region, e. g. with a field dielectric and an electrode material (for instance oxide and polysilicon). In total, for instance at least two combined chipping and oxide peeling stoppers can be arranged in the edge termination region, possible upper limits being for instance not more than six or four combined chipping and oxide peeling stoppers. Laterally, the combined chipping and oxide peeling stopper(s) can be arranged between the sodium stopper and the die edge and/or between the channel stopper and the die edge.

The disclosure relates also to a semiconductor wafer with a semiconductor body on which an insulation layer is formed. In the semiconductor body, a first and a second active region are formed, a dicing region arranged laterally in between. The dicing region defines an area to be subjected to a separation processing step, for instance by a laser beam (laser dicing). After separating the wafer along the dicing region, the first and second active regions are arranged in separate dies. Regarding a possible device setup in a respective active region, reference is made to the disclosure above.

In the insulation layer of the wafer, a first and a second sodium stopper are formed. The first sodium stopper extends around the first active region and the second sodium stopper extends around the second active region, partially or over a whole circumference respectively (see above). Therein, each sodium stopper trench is filled with a tungsten material, at least partly or as a whole (see above). Seen in a vertical cross-section, the sectional plane intersecting the first and the second active region, the dicing region is arranged between the first and the second sodium stopper. Laterally on one side of the dicing region, the first sodium stopper and the first active region are arranged, the second sodium stopper and the second active region being arranged laterally opposite on the other side.

In an embodiment, a first and a second trench are arranged in the dicing region, wherein the first trench is deeper than the second trench. This shall also be disclosed independently of the sodium stopper or stoppers, in particular independently of a tungsten filled sodium stopper. The depth difference between the trenches in the dicing region can for instance be at least 100 nm, 200 nm, 300 nm or 400 nm, possible upper limits being for instance 17000 nm, 12000 nm, 10000 nm, 8000 nm, 6000 nm, 4000 nm, 3000 nm, 2500 nm, 1800 nm, 1600 nm, 1400 nm, 1200 nm or 1000 nm. The first trench can for example be a needle trench, the second trench being e. g. a longitudinal trench (with a longitudinal extension seen in a top view).

In an embodiment, the first trench has the same depth like field electrode trenches formed in the active regions and/or the second trench has the same depth like gate trenches formed in the active region. The first trench can be etched and/or filled in the same process step or steps like the field electrode trenches and/or like chipping stopper trenches discussed above. The second trench can for instance be etched and/or filled in the same process step like the gate trenches and/or channel stopper trenches, in particular those having a reduced depth.

In an embodiment, the first trench is a needle trench and the second trench is a longitudinal trench which surrounds the needle trench seen in a top view. In the top view, the longitudinal trench can for instance form a grid, for example with rectangular or in particular quadratic cells. In a cell, a respective needle trench can be arranged, for instance respectively one needle trench per cell in the center thereof. The longitudinal trench can surround the respective cell e. g. completely, namely as a closed line.

The invention relates also to a method for manufacturing a semiconductor wafer and/or respective semiconductor die. Therein, the sodium stopper(s) is or are formed by etching the insulation layer groove(s) and filling them at least partly or completely with the tungsten material.

Regarding further manufacturing details, reference is made to the description above and/or to the exemplary embodiments.

In an embodiment, a chipping stopper trench discussed above is etched in the same process step as a needle trench in the active region and/or in the dicing region. Therein, the chipping stopper trench is etched as a longitudinal trench in the edge termination region, wherein needle trenches are etched in the active region and/or dicing region.

BRIEF DESCRIPTION OF THE DRAWINGS

Below, the semiconductor die or wafer and the manufacturing of the same are explained in further detail by means of exemplary embodiments. Therein, the individual features can also be relevant for the invention in a different combination.

DETAILED DESCRIPTION

Figure 1:
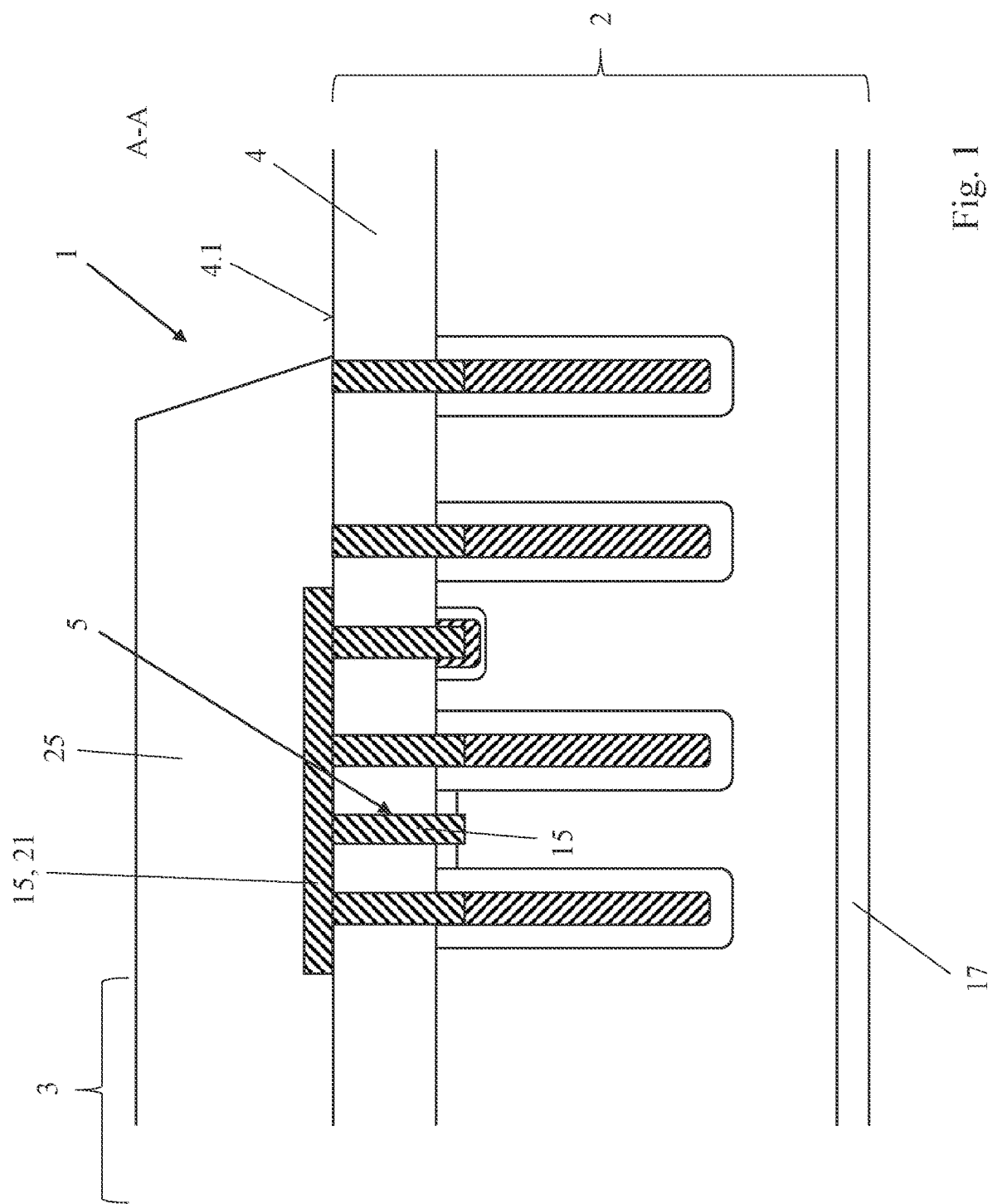
FIG. 1 shows a portion of a semiconductor die in a vertical cross-section illustrating an edge termination region.

FIG. 1 shows a portion of a semiconductor die 1 in a vertical cross-section. The sectional plane lies at a corner of the die 1, see FIG. 4 for illustration. The die 1 comprises a semiconductor body 2 with an active region 3 (see FIGS. 5 and 6 in detail). On the semiconductor body 2, an insulation layer 4 is formed, namely a BPSG layer in the embodiment here. The insulation layer 4 is interrupted by a sodium stopper 5 preventing a sodium diffusion in the insulation layer 4 into the active region 3. The sodium stopper 5 is formed of a tungsten material 15, which can allow for a compact design. On a frontside 4.1 of the insulation layer 4, a metallization layer 21 is arranged, which is also made of tungsten material 15. A passivation layer 25 is deposited directly onto the metallization layer 21, made of imide in this example.

In the following, reference is also made to the enlarged view of FIG. 2. The metallization layer 21 has a vertical thickness 10 of about 100-200 nm, which can enable a precise structuring. An insulation layer groove 20, in which the tungsten material 15 of the sodium stopper 5 is arranged, intersects the insulation layer 4 vertically. It extends even further down into the semiconductor body 2, forming a drain contact 16 there. To improve the electrical connection, it intersects a doped region 17.

In the edge termination region 18, in which the sodium stopper 5 is formed, further etch termination structures are provided. A channel stopper 30 in a channel stopper trench 31 can be electrically contacted via the metallization layer 21. Applying an electrical potential to the channel stopper 30 can for instance prevent ions from entering into the active region 3. Furthermore, chipping stoppers 35 are formed in the semiconductor body 2 in respective chipping stopper trenches 36. The sodium stopper 5 is arranged laterally in between two chipping stoppers 35. In this example, the chipping stopper trenches 36 are respectively filled with an electrically conductive material 38 contacted via the metallization layer 21, the chipping stoppers 35 serving also as channel stoppers 37. They are on the same electrical potential as the channel stopper 30, the sodium stopper 5 and the drain contact 16.

Figure 2:
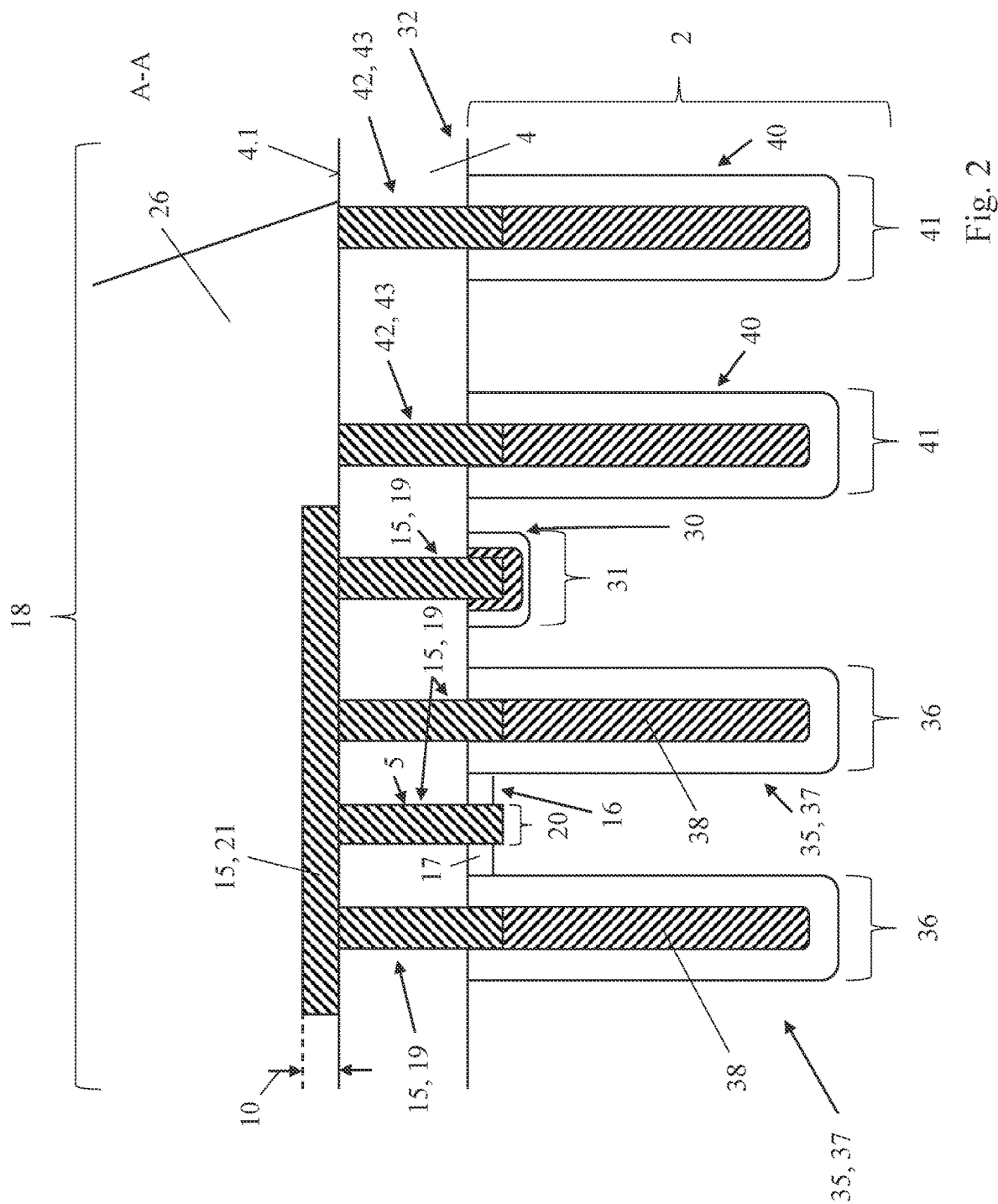
FIG. 2 shows a detailed view of the edge termination region of FIG. 1.

Laterally between the sodium stopper 30 and an edge 32 of the die 1, further chipping stoppers 40 in further chipping stopper trenches 41 are formed (four in total, two of them being shown in FIG. 2). In contrast to the chipping stopper trenches 36, the further chipping stopper trenches 41 are not connected to the metallization layer 21. Nevertheless, a respective vertical groove 42 is formed in the insulation layer 4 above each further chipping stopper trench 41, the grooves 42 acting as oxide peeling stoppers 43. In this example, each groove 20, 42 or interconnect 19 formed in the insulation layer 4 is filled with tungsten material 15.

Figure 3:
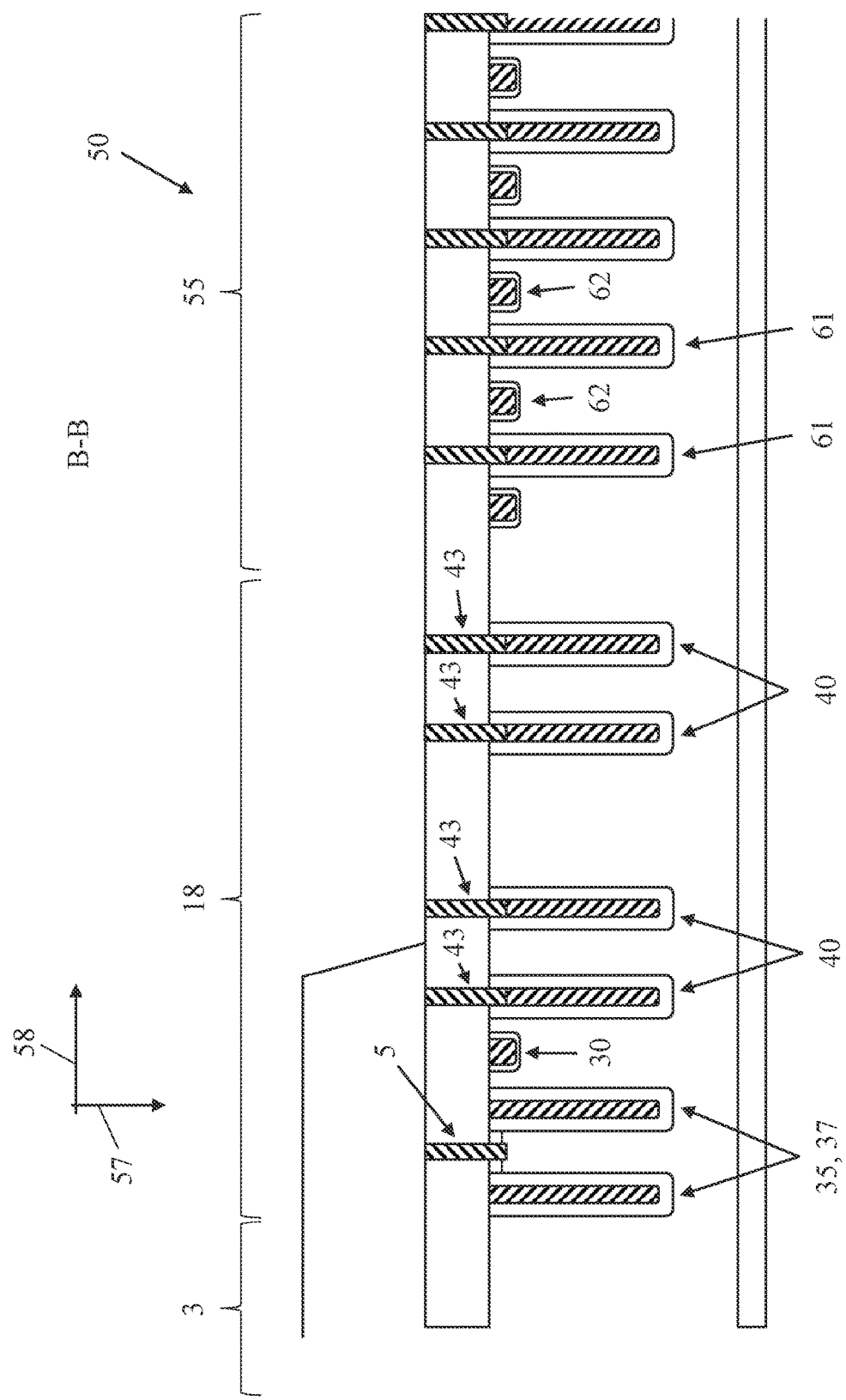
FIG. 3 shows a portion of a wafer in a cross-sectional view illustrating the edge termination region and a dicing region.
Figure 4:
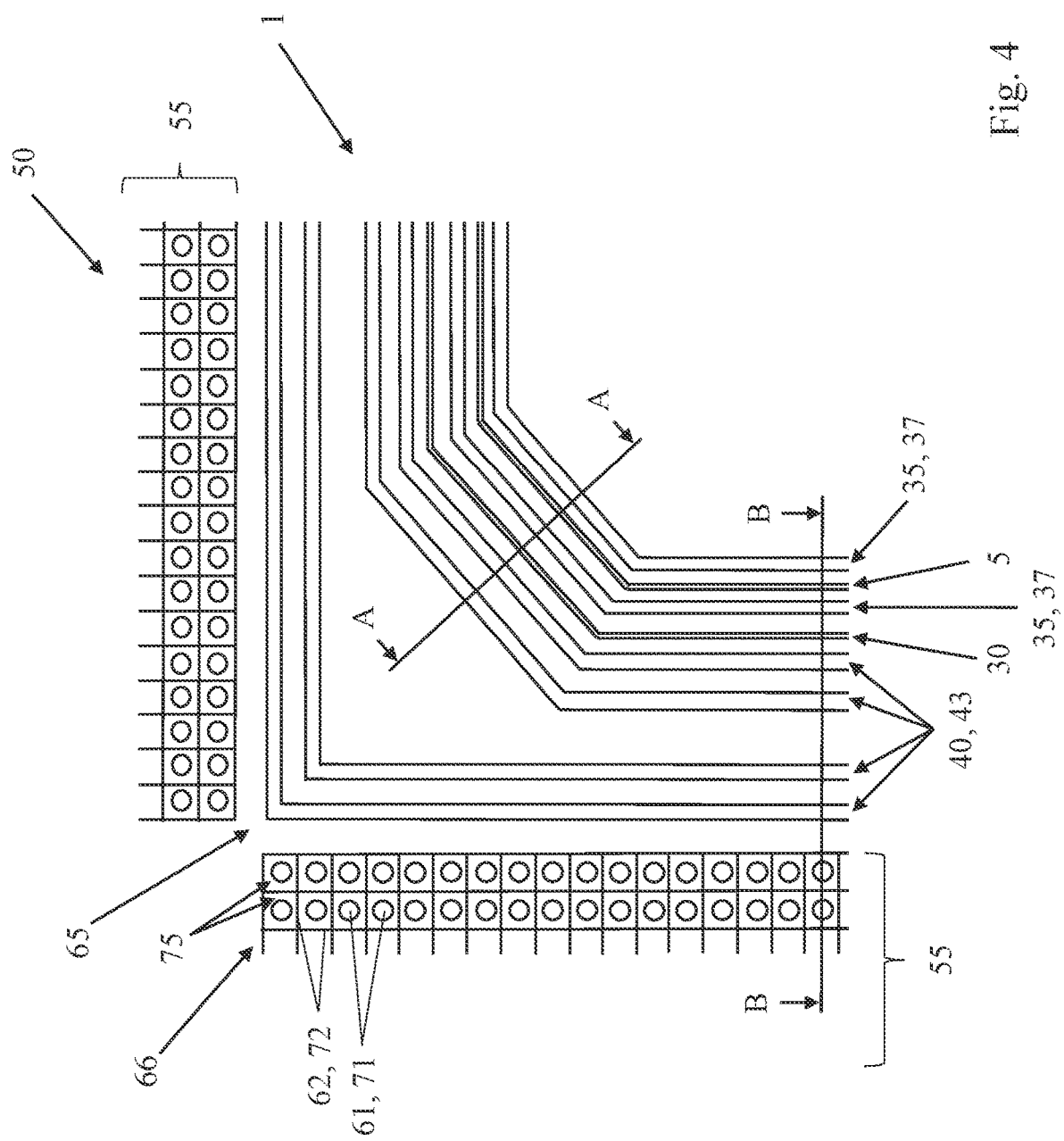
FIG. 4 shows a portion of a wafer in a top view illustrating the edge termination region at the corner and the dicing region.

FIG. 3 shows a portion of a wafer 50 in a vertical cross-section, the cross-sectional plane lying not at a die corner in contrast to FIGS. 1 and 2 (see FIG. 4). In addition to the active region 3 and the edge termination region 18, a dicing region 55 is visible. The dicing region 55 is arranged in between active regions, which belong to separate dies after the separation process, e. g. laser dicing. A comparison between FIGS. 2 and 3 illustrates, that the metallization layer 15 connecting and contacting the different edge termination structures is only formed at the corner of the die. However, the sodium stopper 5 extends over the whole circumference around the active region 3, the same applies for the channel/chipping and oxide peeling stoppers 30, 35, 37, 40, 43. As mentioned above, two further combined chipping and oxide peeling stoppers 40, 43 are arranged between the die edge 32 or dicing region 55 and the active region 3.

In the dicing region 55, first trenches 61 and second trenches 62 are formed. The first trenches 61 extend deeper into the semiconductor body 2 than the second trenches 62. In this example, the first trenches 61 have the same depth like the chipping stopper trenches 36 and the further chipping stopper trenches 41, and the second trenches 62 have the same depth as the channel stopper trench 31. For orientation, a vertical direction 57 and a lateral direction 58 are shown.

FIG. 4 illustrates a portion of the wafer 50 in a top view showing a corner 65 of the die 1 and the dicing regions 55 formed there (the die 1 is not separated from the wafer 50 yet). The first trenches 61 are needle trenches 71. They are arranged in a grid 66 formed by the second trenches 62 which are elongated trenches 72. In this example, the elongated trenches 72 form quadratic cells 75, wherein a needle trench 71 is arranged centrally in each cell 75. Furthermore, the top view illustrates the lateral extension of the die edge termination structures discussed above, in the top and in the cross-sectional view the same reference numerals are used for the same structure, respectively. For illustration, the sectional planes A-A of FIGS. 1/2 and B-B of FIG. 3 are indicated.

Figure 5:
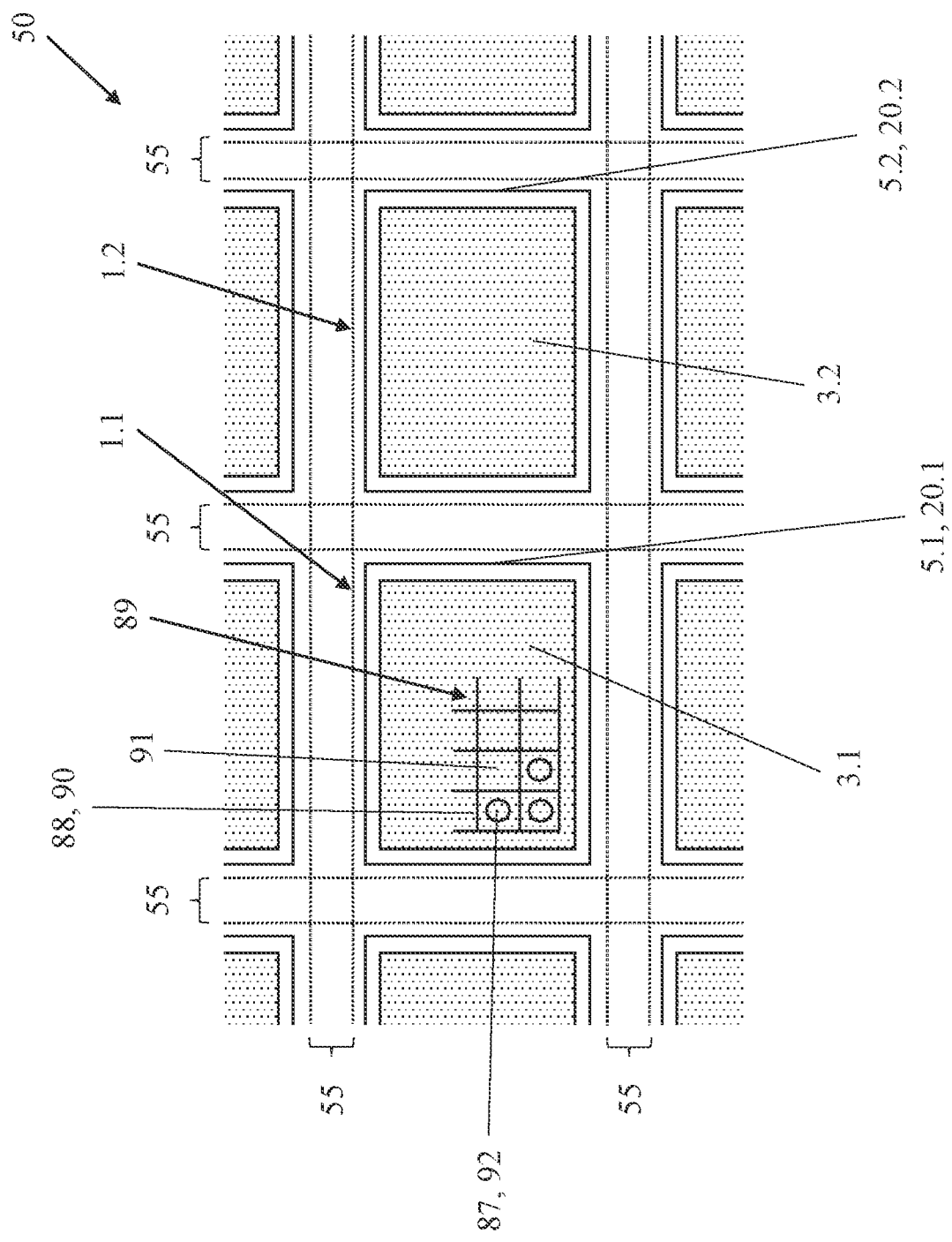
FIG. 5 shows a portion of a wafer in a schematic top view illustrating a plurality of active regions.

FIG. 5 is a schematic top view of a larger portion of the wafer 50. A first active region 3.1 and a second active region 3.2 are shown, furthermore dicing regions 55 extending along the active regions 3.1, 3.2 are illustrated. Regarding their setup in detail, reference is made to FIGS. 3 and 4.

After separating the wafer 5 along the dicing regions 55, the active regions 3.1, 3.2 are arranged in separate dies 1.1, 1.2. The schematic top view illustrates also a first sodium stopper 5.1 which surrounds the first active region 3.1 in a first groove 20.1 over a whole circumference as a closed line, and a second sodium stopper 5.2 surrounding the second active region 3.2 in a second groove 20.2. The other die edge structures discussed above are not shown in this schematic drawing, which applies also for the first and second trenches 61, 62 formed in the dicing regions 55.

Figure 6:
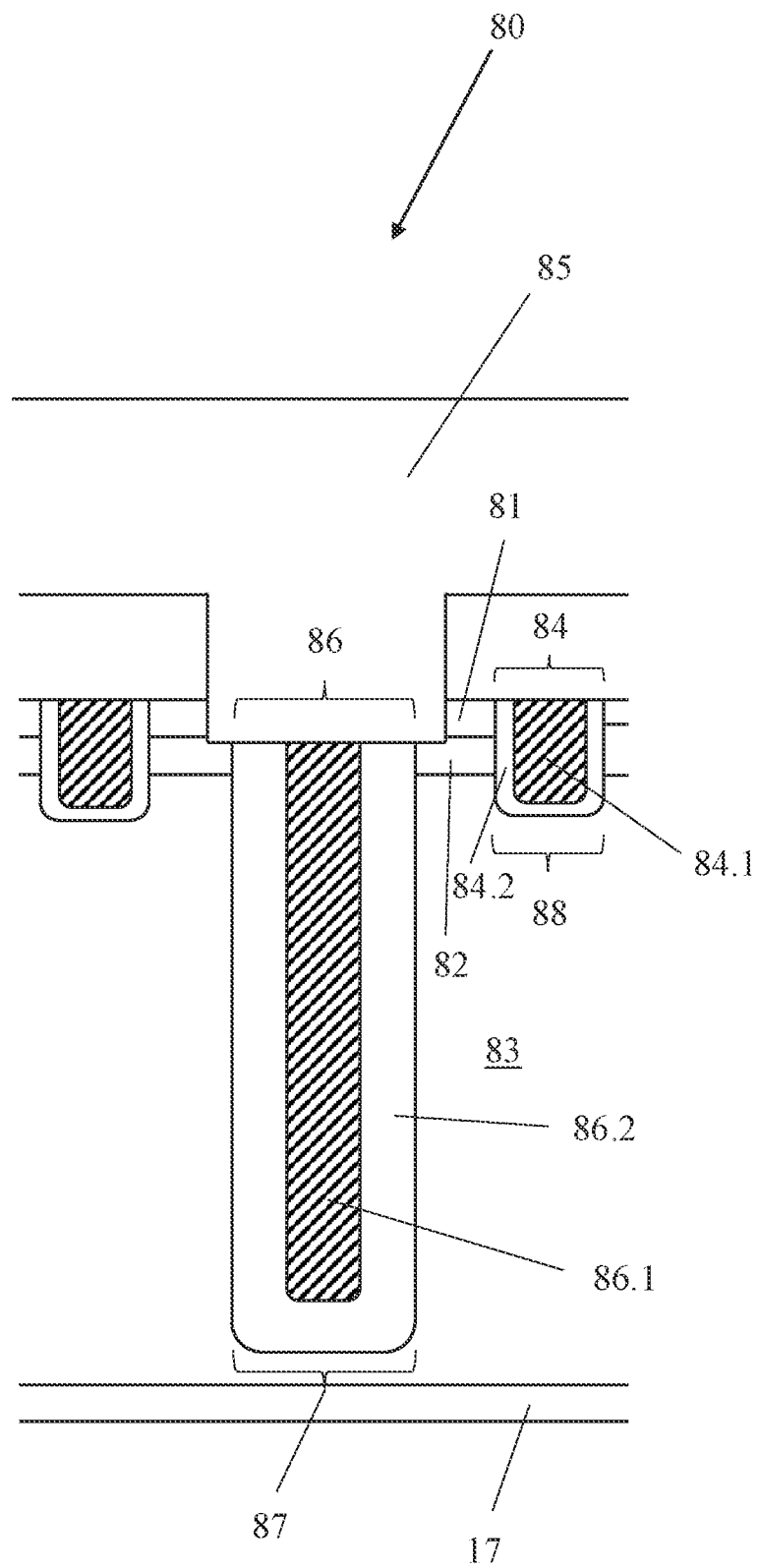
FIG. 6 shows a vertical cross-section of a transistor cell formed in an active region of a wafer or die.

FIG. 6 shows a vertical cross-section of a semiconductor transistor device 80 that can be formed in an active region 3. It comprises a source region 81, a body region 82, and a drift region 83 formed vertically between the body region 82 and the drain region 17. Further, it comprises a gate region 84 laterally aside the body region 82. In the gate region 84, a gate electrode 84.1 is arranged, separated from the body region 82 by an interlayer dielectric 84.2. By applying a voltage to the gate electrode 84.1, a channel formation in the body region 82 can be controlled.

The source and the body region 81, 82 are electrically contacted by the same frontside metallization 85. In this example, the source region 81, the drift region 83 and the drain region 17 are n-type, wherein the body region 82 is p-type. The frontside metallization 85 contacts further a field electrode 86.1 separated from the body and the drift region 82, 83 by a field dielectric 86.2. The field electrode 86.1 and the field dielectric 86.2 form a field electrode region 86. The field electrode region 86 is arranged in a field electrode trench 87, and the gate region 84 is arranged in a gate trench 88. In FIG. 5 the lateral arrangement of these trenches 87, 88 is shown (in a portion of the active region 3.1), the gate trenches 88 are longitudinal trenches 90 forming a grid 89 defining cells 91, wherein in each cell 91 a field electrode trench 87 formed as a needle trench 92 is arranged.

Figure 7:
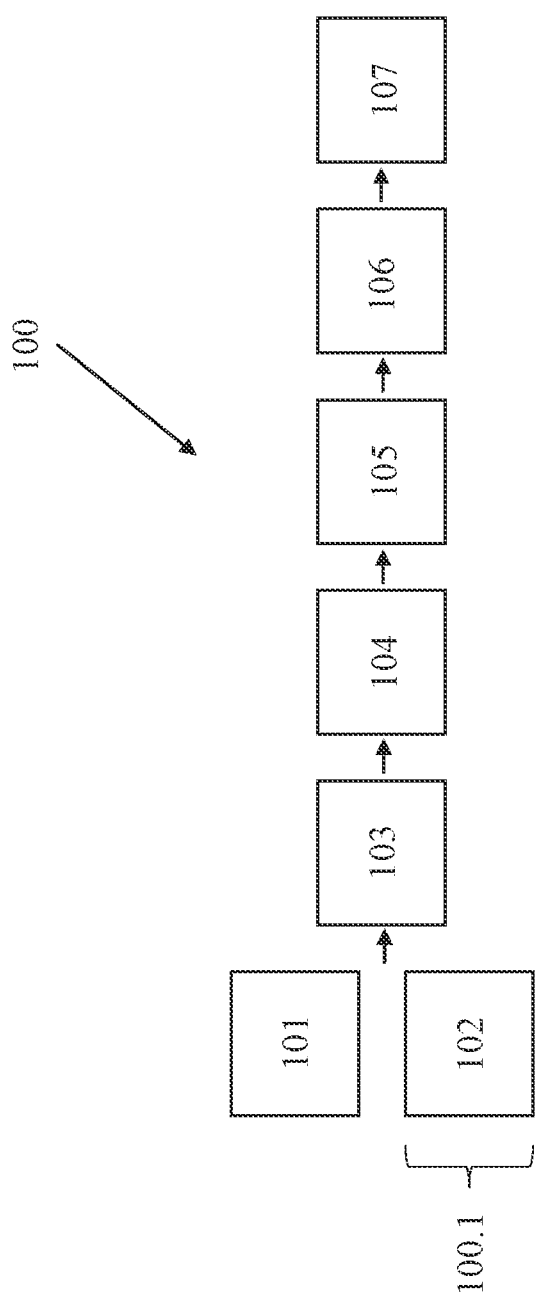
FIG. 7 illustrates the manufacturing of a semiconductor die or wafer in a block diagram.

FIG. 7 illustrates some manufacturing steps 100 in a flow diagram. To obtain a trench structure discussed above, the channel stopper trench 31, second trenches 62 and gate trenches 88 are etched 101 into the semiconductor body 2. In a different process step 100.1 before or thereafter, the chipping stopper trenches 36, the further chipping stopper trenches 41, the first trenches 61, and the field electrode trenches 87 are etched 102. Therein, the longitudinal chipping stopper trenches 36 and the further chipping stopper trenches 41 are etched 101 in the same process step 100.1 like the needle trenches 92 in the active region 3 and the needle trenches 71 in the dicing region 55. After forming the insulation layer 4 on the semiconductor body 3, the insulation layer groove 20 is etched 104 into the insulation layer 4. Subsequently, the insulation layer groove 20 is filled 105 with the tungsten material 15, partly or in particular as a whole. Thereafter, the metallization layer 21 can be deposited 106, and the passivation layer 25 can be deposited 107 directly onto the metallization layer 21. The frontside metallization 80 formed in the active region, e.g. AlCu, can be deposited after the deposition 106 of the metallization layer 21 and before the deposition 107 of the passivation layer 25. In case that a solderable frontside is requested, a further metallization can be deposited onto the frontside metallization 80 after the deposition 107 of the passivation layer 25, e.g. TiW/Cu, for instance with a thickness of several micrometers (e.g. 5 μm).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a semiconductor body comprising an active region and an edge termination region;
   an insulation layer on the semiconductor body; and
   a sodium stopper formed in the insulation layer,
   wherein the sodium stopper is arranged in an insulation layer groove which intersects the insulation layer vertically and extends uninterrupted around the active region,
   wherein the sodium stopper is formed of a tungsten material that at least partly fills the insulation layer groove,
   wherein both the insulation layer groove and the tungsten material extend into the semiconductor body.

2. The semiconductor die of claim 1, further comprising:
   a metallization layer on a frontside of the insulation layer,
   wherein the metallization layer covers at least a section of the insulation layer groove and is formed of a tungsten material.

3. The semiconductor die of claim 2, further comprising:
   a passivation layer covering the metallization layer.

4. The semiconductor die of claim 1, wherein the tungsten material that at least partly fills the insulation layer groove also forms a drain contact electrically connected to a drain region formed at least in the active region of the semiconductor body.

5. The semiconductor die of claim 1, further comprising:
   a trench extending vertically into the semiconductor body,
   wherein the trench is arranged laterally between the sodium stopper and a lateral edge of the semiconductor die.

6. The semiconductor die of claim 1, further comprising:
   a chipping stopper in a chipping stopper trench extending vertically into the semiconductor body.

7. The semiconductor die of claim 6, wherein the chipping stopper trench is filled with an electrically conductive material and serves also as a channel stopper.

8. The semiconductor die of claim 5, further comprising:
   a vertical groove intersecting the insulation layer above the trench,
   wherein the vertical groove serves as a peeling stopper.

9. The semiconductor die of claim 1, further comprising:
   a channel stopper in a channel stopper trench extending vertically into the semiconductor body; and
   a chipping stopper in a chipping stopper trench extending vertically into the semiconductor body,
   wherein the channel stopper is arranged laterally between the sodium stopper and a lateral edge of the semiconductor die.

10. The semiconductor die of claim 1, wherein the sodium stopper forms a contact with the semiconductor body.

11. The semiconductor die of claim 1, wherein the sodium stopper is covered and contacted by a passivation layer.

12. The semiconductor die of claim 1, wherein the tungsten material only partly fills the insulation layer groove.

13. A semiconductor wafer, comprising:
   a semiconductor body comprising a first active region and a second active region;
   an insulation layer on the semiconductor body;
   a dicing region formed laterally between the first active region and the second active region;

a first sodium stopper and a second sodium stopper formed in the insulation layer, wherein the first sodium stopper is arranged in a first insulation layer groove which intersects the insulation layer vertically and extends uninterrupted around the first active region, wherein the second sodium stopper is arranged in a second insulation layer groove which intersects the insulation layer vertically and extends uninterrupted around the second active region, wherein the first sodium stopper is formed of a tungsten material that at least partly fills the first insulation layer groove, wherein the second sodium stopper is formed of a tungsten material that at least partly fills the second insulation layer groove, wherein both the first insulation layer groove and the tungsten material that at least partly fills the first insulation layer groove extend into the semiconductor body, wherein both the second insulation layer groove and the tungsten material that at least partly fills the second insulation layer groove extend into the semiconductor body.

14. The semiconductor wafer of claim 13, further comprising:

a first trench and a second trench arranged in the dicing region, wherein the first trench extends deeper into the semiconductor body than the second trench.

15. The semiconductor wafer of claim 14, wherein the first trench has the same depth as field electrode trenches formed in the first active region and the second active region, and wherein the second trench has the same depth as gate trenches formed in the first active region and the second active region.

16. The semiconductor wafer of claim 14, wherein the first trench is a needle trench and the second trench is a longitudinal trench surrounding the needle trench.

17. The semiconductor die of claim 2, wherein the metallization layer is in contact with the tungsten material in the insulation layer groove.

18. The semiconductor die of claim 17, further comprising:

a passivation layer covering the metallization layer.

19. The semiconductor die of claim 17, wherein the tungsten material in the insulation layer groove extends from a first sidewall of the insulation layer groove to a second sidewall of the insulation layer groove.

20. The semiconductor die of claim 1, further comprising:

a first trench arranged in the edge termination region and extending vertically into the semiconductor body; and a second trench arranged in the edge termination region and extending vertically into the semiconductor body, wherein the sodium stopper is arranged between the first trench and the second trench, and wherein the sodium stopper is at least partly isolated from the first trench and the second trench.

21. The semiconductor die of claim 1, wherein the active region comprises a plurality of cells, each cell comprising a field electrode trench formed as a needle trench.

22. The semiconductor die of claim 1, wherein the tungsten material extends above the insulation layer.

23. The semiconductor die of claim 1, wherein the tungsten material spans at least a bottom of the insulation layer groove.

* * * * *